(12) United States Patent
Reynov et al.

(10) Patent No.: US 8,273,994 B2
(45) Date of Patent: Sep. 25, 2012

(54) BGA FOOTPRINT PATTERN FOR INCREASING NUMBER OF ROUTING CHANNELS PER PCB LAYER

(75) Inventors: Boris Reynov, Cupertino, CA (US); Ping Yue, San Jose, CA (US); Shreeram Siddhaye, Sunnyvale, CA (US); John Cleveland, Cupertino, CA (US); Chebrolu Srinivas, San Jose, CA (US); Srinivas Venkataraman, Santa Clara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 353 days.

(21) Appl. No.: 12/647,737

(22) Filed: Dec. 28, 2009

(65) Prior Publication Data

US 2011/0155434 A1    Jun. 30, 2011

(51) Int. Cl.
H05K 1/11 (2006.01)
H05K 7/00 (2006.01)
H05K 1/18 (2006.01)

(52) U.S. Cl. ........ 174/261; 174/262; 361/777; 361/778; 361/779

(58) Field of Classification Search .......... 174/262–266, 174/261; 257/737, 738; 361/792–795, 777–779; 228/180.1
See application file for complete search history.

(56) References Cited

U.S. PATENT DOCUMENTS

| | | | |
|---|---|---|---|
| 6,373,139 B1 * | 4/2002 | Clark | 257/774 |
| 6,622,905 B2 * | 9/2003 | Shier et al. | 228/180.22 |
| 6,913,948 B2 * | 7/2005 | Caletka et al. | 438/108 |
| 2002/0084312 A1 * | 7/2002 | Shier et al. | 228/180.22 |
| 2002/0108777 A1 * | 8/2002 | Joy et al. | 174/260 |
| 2003/0047348 A1 | 3/2003 | Jessep et al. | |
| 2007/0034405 A1 * | 2/2007 | Brown | 174/262 |
| 2008/0277152 A1 * | 11/2008 | Watanabe | 174/262 |
| 2009/0032948 A1 | 2/2009 | Hsieh | |
| 2009/0242242 A1 | 10/2009 | Ishii et al. | |

FOREIGN PATENT DOCUMENTS

WO    WO 2006/053891    5/2006

OTHER PUBLICATIONS

European Search Report corresponding to EP 10 17 0599, mailed Oct. 14, 2010, 7 pages.
European Search Report corresponding to EP 10 17 0599, mailed Nov. 23, 2011, 6 pages.

* cited by examiner

*Primary Examiner* — Timothy Thompson
*Assistant Examiner* — Sherman Ng
(74) *Attorney, Agent, or Firm* — Harrity & Harrity, LLP

(57) ABSTRACT

A printed circuit board (PCB) includes a ball grid array (BGA). The PCB further includes a first BGA pad having a circular shape, and a first via having a circular shape, where the circular shape of the first via overlaps a portion of the circular shape of the first BGA pad and is rotated diagonally relative to a center of the first BGA pad. The PCB also includes a second BGA pad having a circular shape, and a second via having a circular shape, where the circular shape of the second via overlaps a portion of the circular shape of the second BGA pad and is rotated diagonally relative to a center of the second pad, and where a center of the second via is located at a first distance from the center of the first via and at a first angle relative to an axis that crosses a center of the first via.

21 Claims, 8 Drawing Sheets

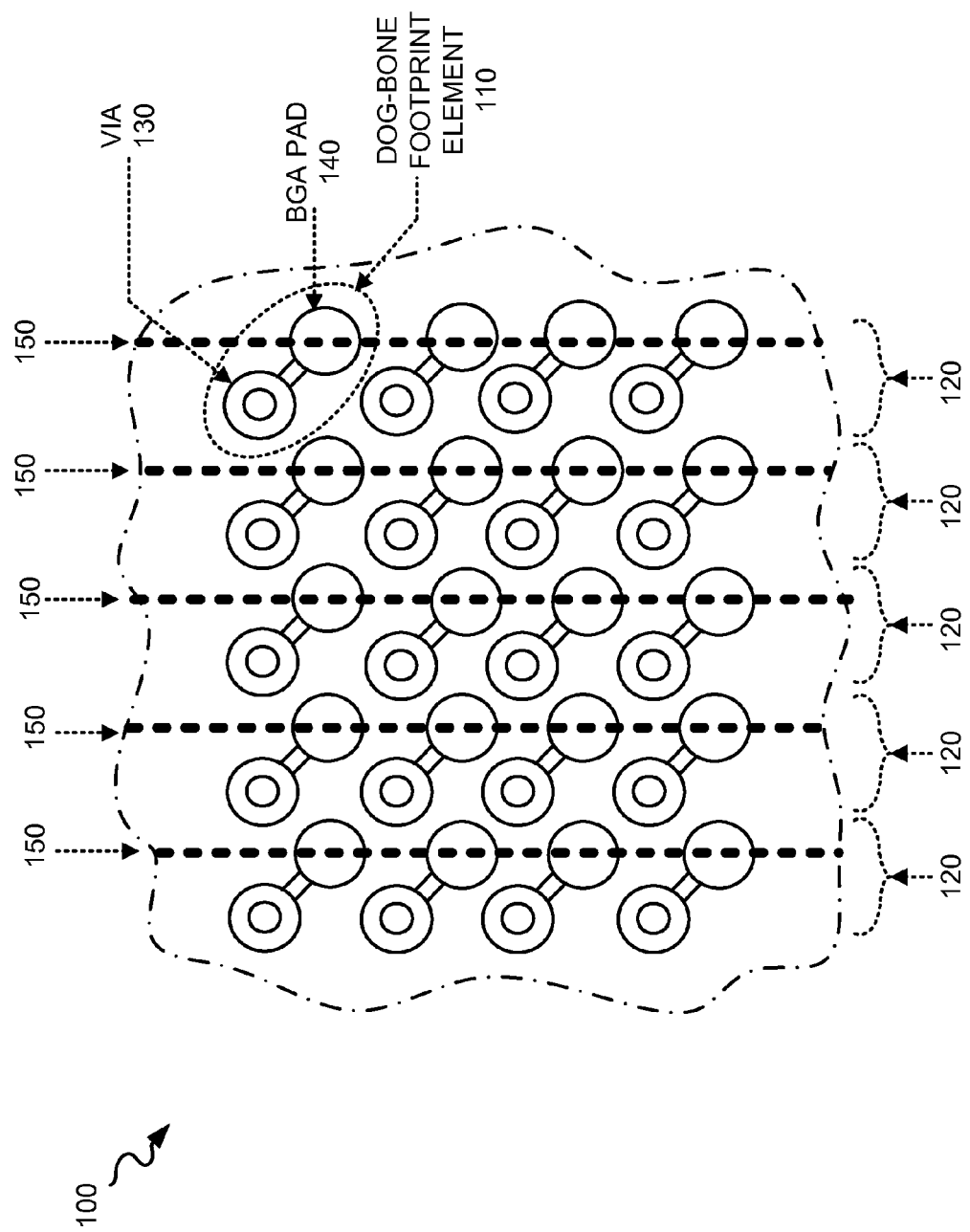

US 8,273,994 B2

BGA FOOTPRINT PATTERN FOR INCREASING NUMBER OF ROUTING CHANNELS PER PCB LAYER

BACKGROUND

A ball grid array (BGA) includes an array of balls of solder that are affixed to pins on the bottom of an integrated circuit (IC) package for electrically connecting the IC package to a printed circuit board (PCB). The IC package may then be placed on the PCB, which has copper conductive pads in a pattern that matches the array of solder balls on the IC package. The solder balls may be heated to cause the solder balls to melt. When the solder cools and solidifies, the hardened solder mechanically attaches the IC package to the PCB.

As shown in FIGS. 1A and 1B, a conventional BGA footprint on a PCB 100 includes a "dog-bone" footprint element 110. Dog-bone footprint element 110 typically includes a via 130, that provides a connecting hole through one or more layers of PCB 100, and a BGA pad 140 upon which a ball of solder of the BGA may be affixed via heating of the solder. A single dog-bone footprint element 110 is typically reproduced in columns 120 on PCB 100 such that the configuration of BGA pads 140 on PCB 100 matches the configuration of the BGA array. At 39.37 mil pitch, the configuration of the dog-bone footprint pattern on PCB 100 provides two routing channels 150 per PCB layer for each pair of columns 120 of the BGA (where a "routing channel" includes an area in the PCB where one conductive trace may be placed). Two routing channels 150 per PCB layer for two columns 120 of the BGA inhibits the "escape" of wiring for edge coupled differential pairs (i.e., pairs of conductors used for differential signaling), typically requiring the wiring for the differential pairs to be routed around vias. Such routing has a negative impact on the signal integrity associated with the differential pairs.

As shown in more detail in FIG. 1B, an existing dog-bone footprint element 110 may be arranged in columns 120, with vias 130 having a distance of d 180 between each successive via 130 in a vertical direction, and a same distance d 190 between each successive via 130 in a horizontal direction. Each dog-bone footprint element 110 may be formed on the PCB at an angle 160 of 45 degrees.

SUMMARY

In accordance with one embodiment, a PCB, including a BGA, further includes a first BGA pad having a circular shape, and a first via having a circular shape, where the circular shape of the first via overlaps a portion of the circular shape of the first BGA pad and is rotated diagonally relative to a center of the first BGA pad. The PCB additionally includes a second BGA pad having a circular shape, and a second via having a circular shape, where the circular shape of the second via overlaps a portion of the circular shape of the second BGA pad and is rotated diagonally relative to a center of the second pad, where a center of the second via is located at a first distance from the center of the first via and at a first angle relative to an axis that crosses a center of the first via.

In another implementation, a PCB having multiple layers and a BGA footprint pattern, includes multiple first BGA footprint elements arranged in a first column, each of the first BGA footprint elements including a first via and a first BGA pad. The PCB further includes multiple second BGA footprint elements arranged in a second column, each of the second BGA footprint elements including a second via and a second BGA pad, where relative spacing and orientation between the first BGA footprint elements and the second BGA footprint elements produce three routing channels per layer of the multiple layers of the PCB for the first and second columns.

In still another implementation, a PCB having multiple layers and a BGA footprint pattern, includes multiple first BGA footprint elements arranged in a first column, each of the first BGA footprint elements including a first via and a first BGA pad and where the first BGA pad and the first via have circular shapes, and where the first via overlaps a portion of the first BGA pad and is rotated diagonally relative to a center of the first BGA pad. The PCB further includes multiple second BGA footprint elements arranged in a second column, each of the second BGA footprint elements including a second via and a second BGA pad, where the second BGA pad and second via have circular shapes, where the second via overlaps a portion of the second BGA pad and is rotated diagonally relative to a center of the second pad, and where a center of the second via is located at a first distance and at a first angle relative to an axis that crosses a center of the first via. The relative spacing and orientation between the first BGA footprint elements and the second BGA footprint elements produce three routing channels per layer of the multiple layers of the PCB for the first and second columns, and an orientation of each of the second BGA footprint elements is reversed by 180 degrees from an orientation of each of the first BGA footprint elements on the PCB.

BRIEF DESCRIPTION OF THE DRAWINGS

The accompanying drawings, which are incorporated in and constitute a part of this specification, illustrate one or more embodiments described herein and, together with the description, explain the invention. In the drawings, FIGS. 1A and 1B are diagrams of existing PCB BGA "dog-bone" footprint elements arranged in columns to form a BGA footprint pattern;

DETAILED DESCRIPTION

The following detailed description refers to the accompanying drawings. The same reference numbers may be used in different drawings to identify the same or similar elements. Also, the following detailed description does not limit the invention. Instead, the scope of the invention is defined by the appended claims and equivalents.

Figure 1B:
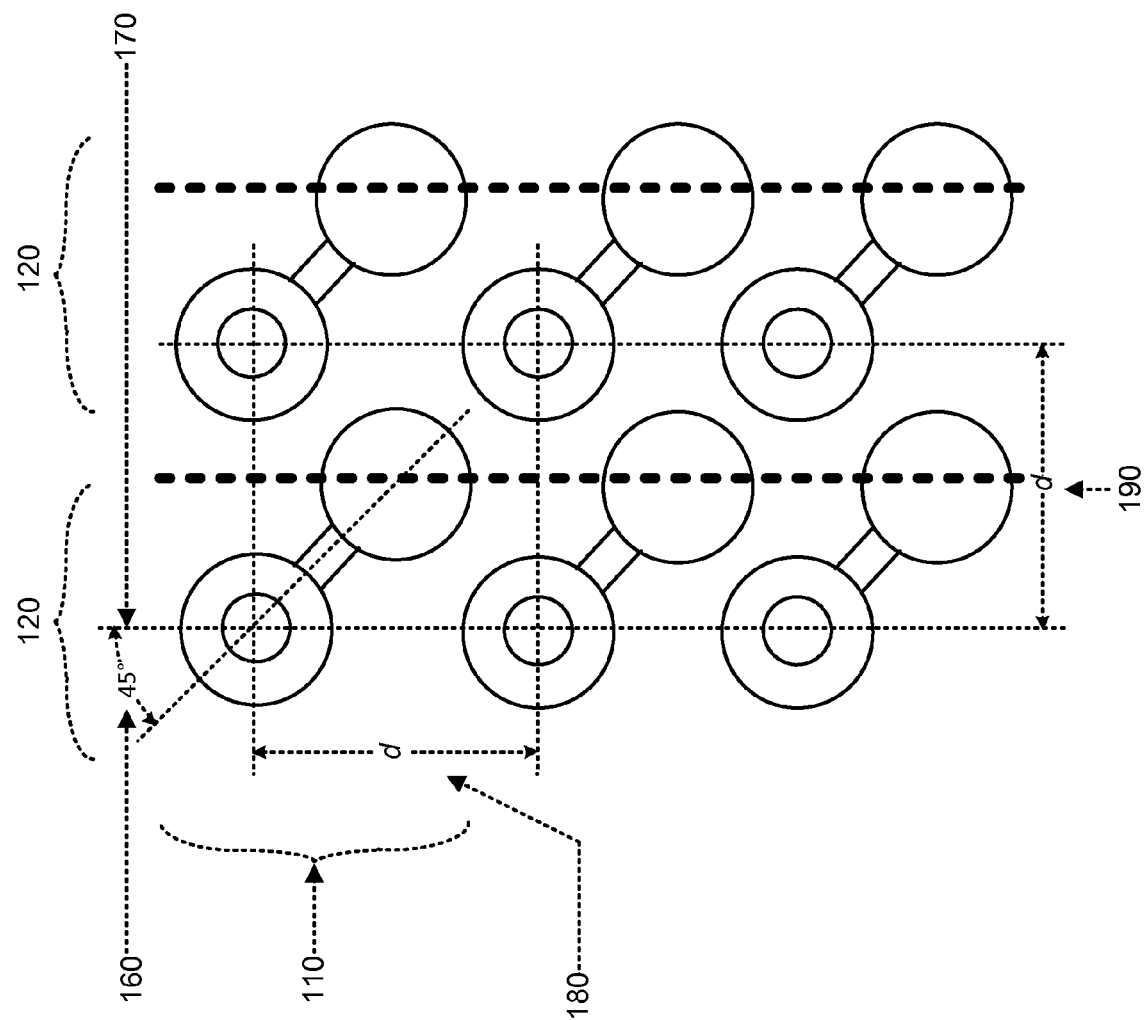

A BGA footprint pattern, as described herein, increases the number of routing channels per PCB layer, relative to existing dog-bone BGA footprint patterns, thereby enabling the reduction of the number of layers in a PCB. Every two adjacent columns of the BGA footprint pattern described herein include vias that are rotated diagonally toward one another leaving a wide routing opening between every two columns. As a result, the BGA footprint pattern includes three routing channels per two columns per PCB layer instead of the two routing channels per two columns per PCB layer of the dog-bone footprint pattern of FIGS. 1A and 1B. The increase in the number of routing channels increases a number of escape routes from the BGA in the layers of the PCB by 50%. A "routing channel" as used herein refers to a region within the PCB where one conductive trace may be placed. Therefore, a wider gap between BGA footprint elements increases the number of routing channels that may accommodate more conductive traces.

Figure 2A:
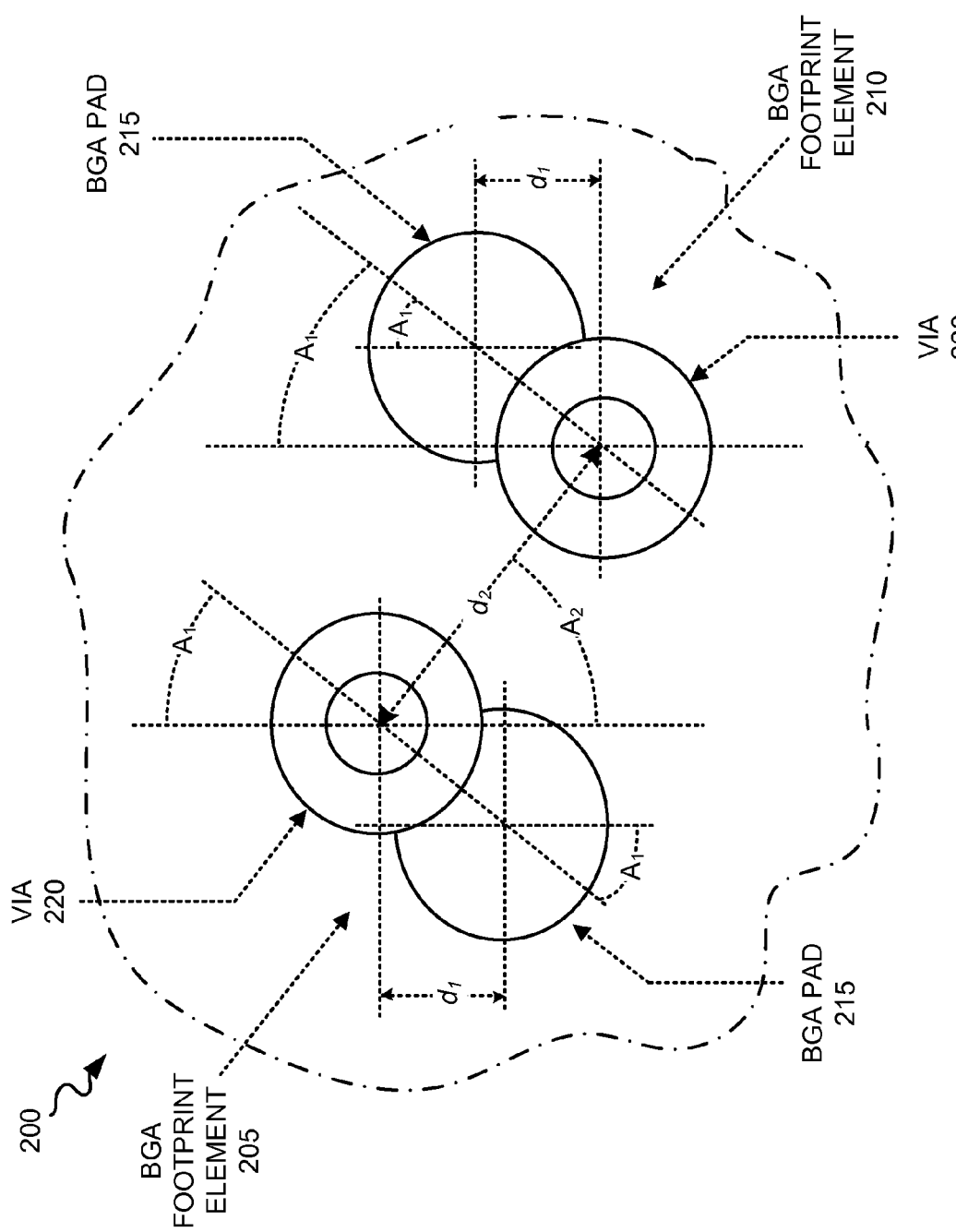
FIGS. 2A and 2B are diagrams of a BGA footprint pattern that increases a number of routing channels per PCB layer, relative to the dog-bone footprint pattern of FIGS. 1A and 1B, according to exemplary embodiments.

FIG. 2A is a diagram of a pair of BGA footprint elements that may serve as a basis for forming columns of BGA footprint elements on a PCB 200 to increase the number of routing channels per PCB layer. As shown in FIG. 2A, a first BGA footprint element 205 may include a BGA pad 215 and a via 220, where a circular shape of via 220 overlaps a portion of the circular shape of BGA pad 215. A center of via 220 may be rotated diagonally relative to a center of BGA pad 215 such that the center of via 220 and the center of BGA pad 215 reside on an axis that forms an angle $A_1$ with a vertical axis that crosses through the center of via 220 (or that forms the angle $A_1$ with a vertical axis that crosses through the center of BGA pad 215). Angle $A_1$ may be approximately 27 degrees. The center of via 220 may be located at a distance $d_1$ from a center of BGA pad 215 along the vertical axis that crosses through the center of via 220. Distance $d_1$ may be approximately equal to 10 mil.

A second BGA footprint element 210 may also include a BGA pad 215 and a via 220. BGA footprint element 210 may be rotated 180 degrees relative to BGA footprint element 205, such that BGA footprint element 205 and BGA footprint element 210 have their respective vias 220 and BGA pads 215 located on opposite sides (i.e., the footprint elements are reversed by 180 degrees). A center of via 220 of BGA footprint element 210 may be rotated diagonally relative to a center of BGA pad 215 of BGA footprint element 210 such that the center of BGA pad 215 and the center of via 220 reside on an axis that forms the angle $A_1$ with a vertical axis that crosses through the center of via 220 (or that forms the angle $A_1$ with a vertical axis that crosses through the center of BGA pad 215). The center of via 220 of BGA footprint 210 may be located at the vertical distance $d_1$ from a center of BGA pad 215 along the vertical axis that crosses through the center of via 220. A center of via 220 of BGA footprint 210 may be located at a distance $d_2$ from the center of via 220 of BGA footprint 205 at an angle $A_2$ from the vertical axis that crosses through the center of via 220 of BGA footprint 205. In one exemplary embodiment, distance $d_2$ may be approximately equal to 36 mil and angle $A_2$ may be approximately equal to 56 degrees.

Figure 2B:
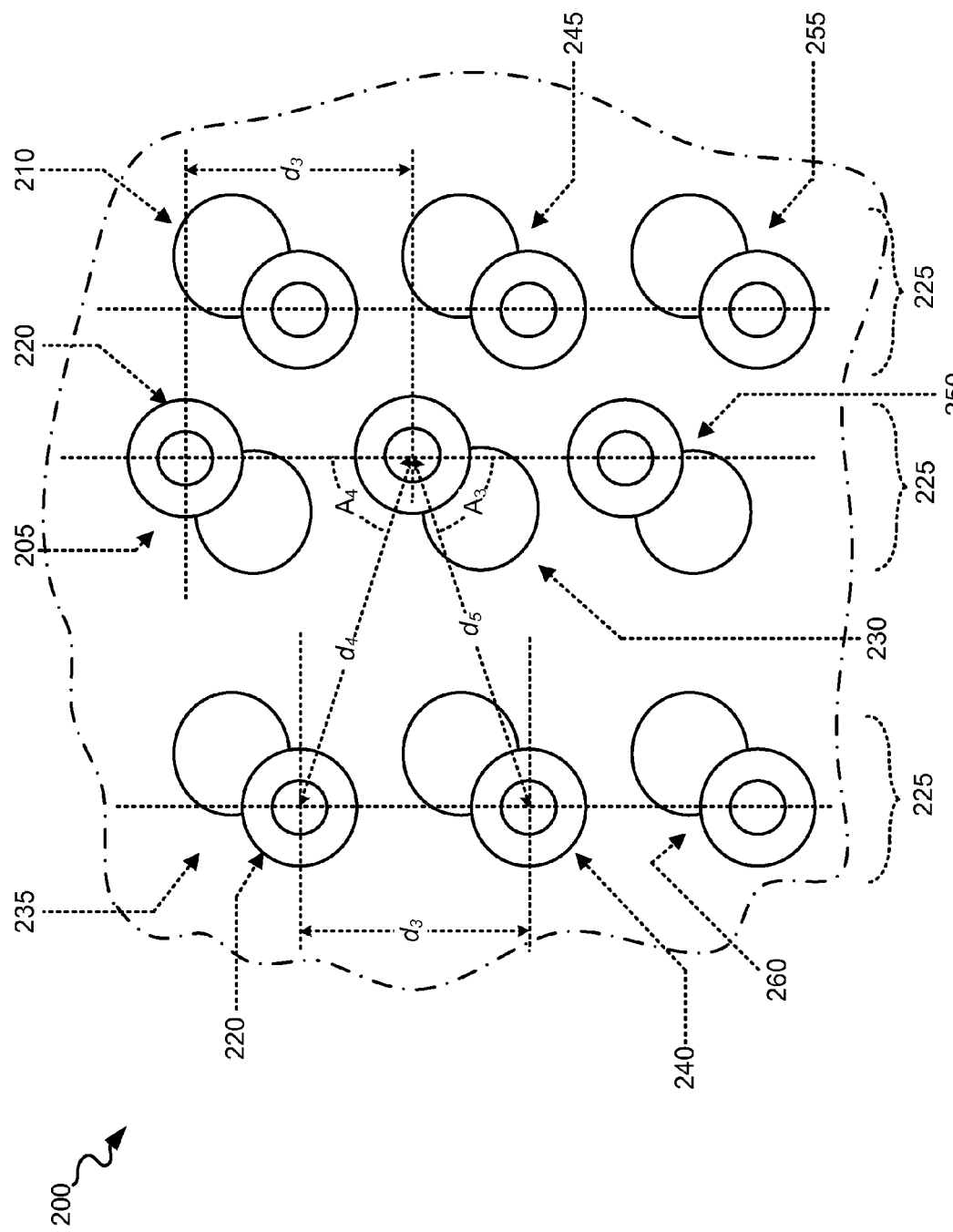

BGA footprint elements 205 and 210 may be replicated on PCB 200 to form multiple columns 225 of BGA footprint elements, as shown in FIG. 2B. As depicted FIG. 2B, a BGA footprint element 230 may be located with a center of its via 220 located along the vertical axis that crosses the center of via 220 of BGA footprint 205 at a distance $d_3$ from the center of via 220 of BGA footprint 205. Distance $d_3$ may be approximately equal 39.37 mil (i.e., equal to the BGA pitch). Another column may be formed on PCB 200 by locating a center of a via 220 of a BGA footprint element 235 at a distance $d_4$ from a center of the via of BGA footprint element 230, and at an angle $A_4$ from an axis that crosses through the center of via 220 of BGA footprint element 230. Distance $d_4$ may be approximately equal to 53 mil, and angle $A_4$ may be approximately equal to 68 degrees. Another BGA footprint element 240 may be located with a center of its via 220 at a distance $d_5$ from the center of via 220 of BGA footprint element 230, and at an angle $A_3$ from the axis that crosses through the center of via 220 of BGA footprint element 230. Distance $d_5$ may be approximately equal to 53 mil, and angle $A_3$ may be approximately equal to 68 degrees.

Additional BGA footprint elements may be added to PCB 200 with similar relative distances and angles as described above with respect to BGA footprint elements 205, 210, 230, 235 and 240. For example, BGA footprint element 245 may be located in a column 225 with its via at a distance $d_2$ from the via of BGA footprint element 230 and at angle $A_2$ from the vertical axis that crosses the center of the via of BGA footprint element 230. BGA footprint element 250 may be formed at distance $d_3$ from BGA footprint element 230 along the axis that crosses the center of vias 220 of BGA footprint elements 205 and 230. BGA footprint element 255 may be located in column 225, along with BGA footprint elements 210 and 245, in a same manner as BGA footprint element 245 is located relative to BGA footprint element 230. BGA footprint element 260 may be located in a column 225, along with BGA footprint elements 235 and 240, along the axis that crosses the center of vias 220 of BGA footprint elements 235 and 240 and at a distance $d_5$ and angle $A_3$ from BGA footprint element 250.

Figure 3A:
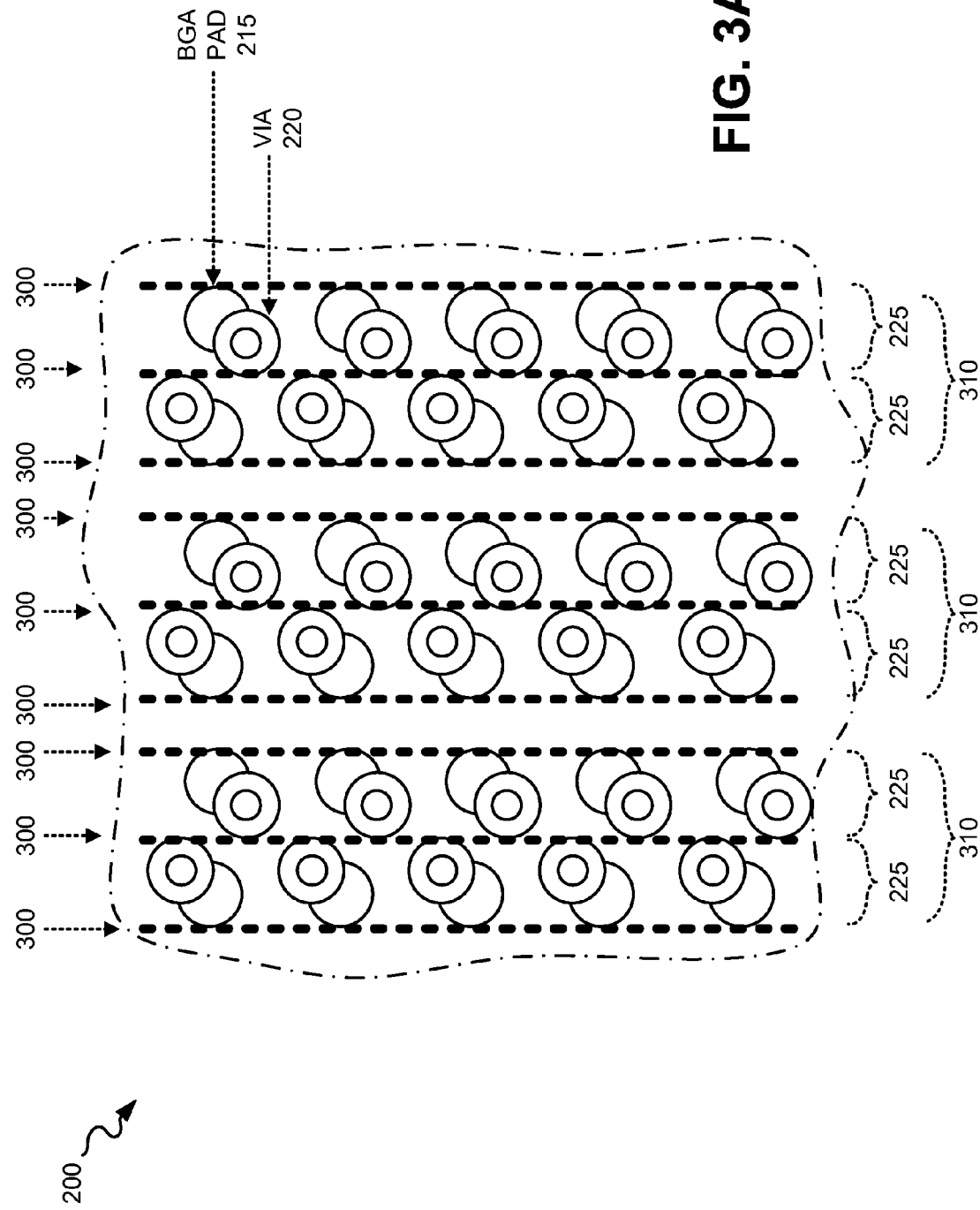
FIG. 3A is a diagram of a top via of a PCB that includes multiple columns of the BGA footprint pattern of FIGS. 2A and 2B.
Figure 3B:
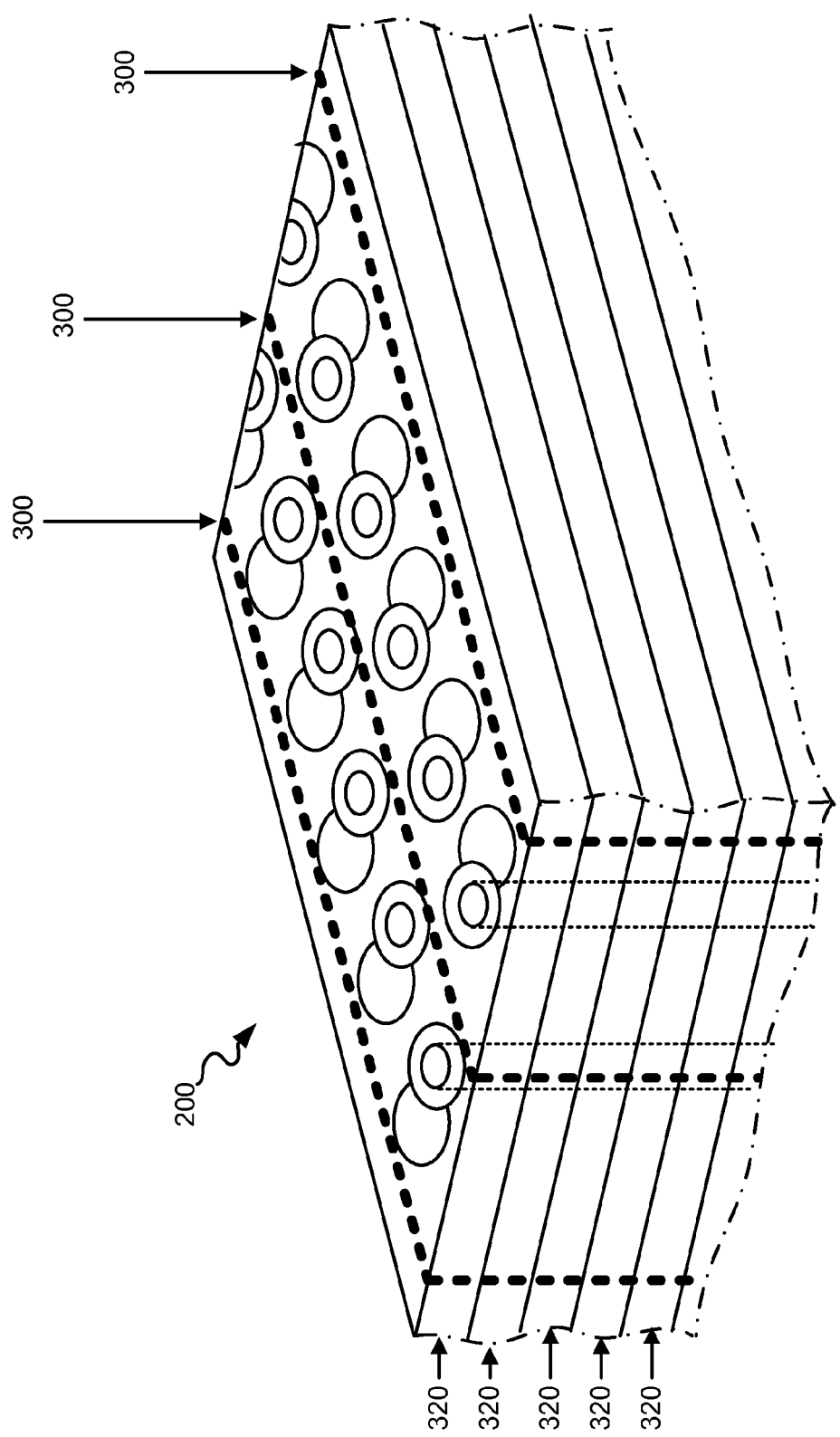
FIG. 3B is a diagram of a cut-away view of multiple layers of the PCB of FIG. 3A that depicts two columns of the BGA footprint pattern of FIGS. 2A and 2B.

The relative distances and angles between BGA footprint elements, described above with respect to FIGS. 2A and 2B, may be repeated to form columns 225 of BGA footprint elements, as further shown in FIGS. 3A and 3B. The spacing and orientation of the BGA footprint elements produce routing channels 300 beneath and between the BGA footprint elements that may be used for routing conductive connections (e.g., conductive traces). As shown, for example, in FIG. 3A, the spacing and orientation of the BGA footprint elements produce three routing channels 300 per PCB layer for each pair 310 of columns 225. A cut-away view is provided in FIG. 3B that shows the three routing channels 300 per PCB layer for a single pair of columns on PCB 200. As can be seen in FIG. 3B, each routing channel 300 extends down through layers 320 of PCB 200, such that each PCB layer 320 in the region of a routing channel 300 may be used to route a conductive connection.

The BGA footprint pattern described above with respect to FIGS. 2A, 2B, 3A, and 3B assumes a 39.37 mil (1 mm) pitch (i.e., the distance between BGA ball centers) and 5 mil traces (the width of conductive traces in or on the PCB). However, it will be recognized that the BGA footprint pattern described herein may also be applied to improving routing with other trace widths, and/or BGAs having other pitch sizes. The sizes, distances, and angles may be varied from the specific sizes, distances, and angles described herein based on the trace width and/or BGA pitch used, regardless of whether the pitch is assumed to be 39.37 mil (1 mm), 0.8 mm, 0.65 mm, 0.5 mm, or any other pitch, including metric or imperial implementations.

Figure 4:
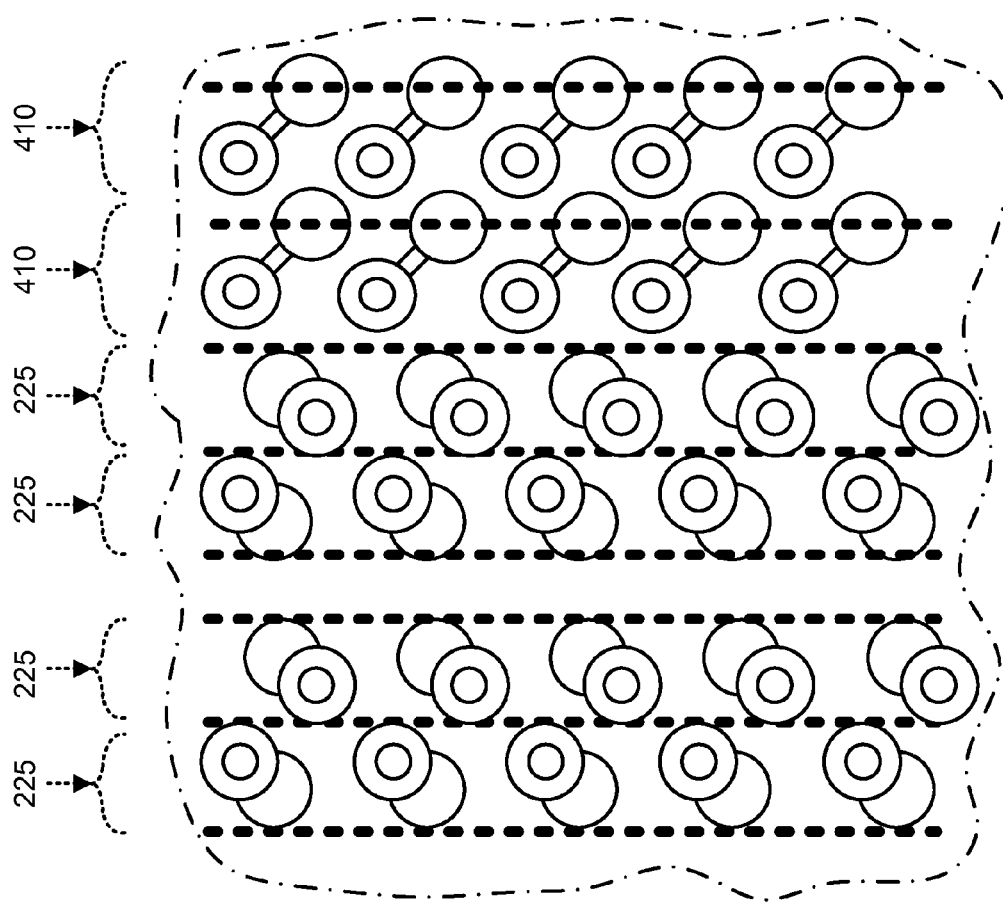
FIG. 4 is a diagram that illustrates an example of a PCB that includes both the BGA dog-bone footprint pattern and the exemplary ball grid array footprint pattern of FIGS. 2A and 2B.
Figure 5:
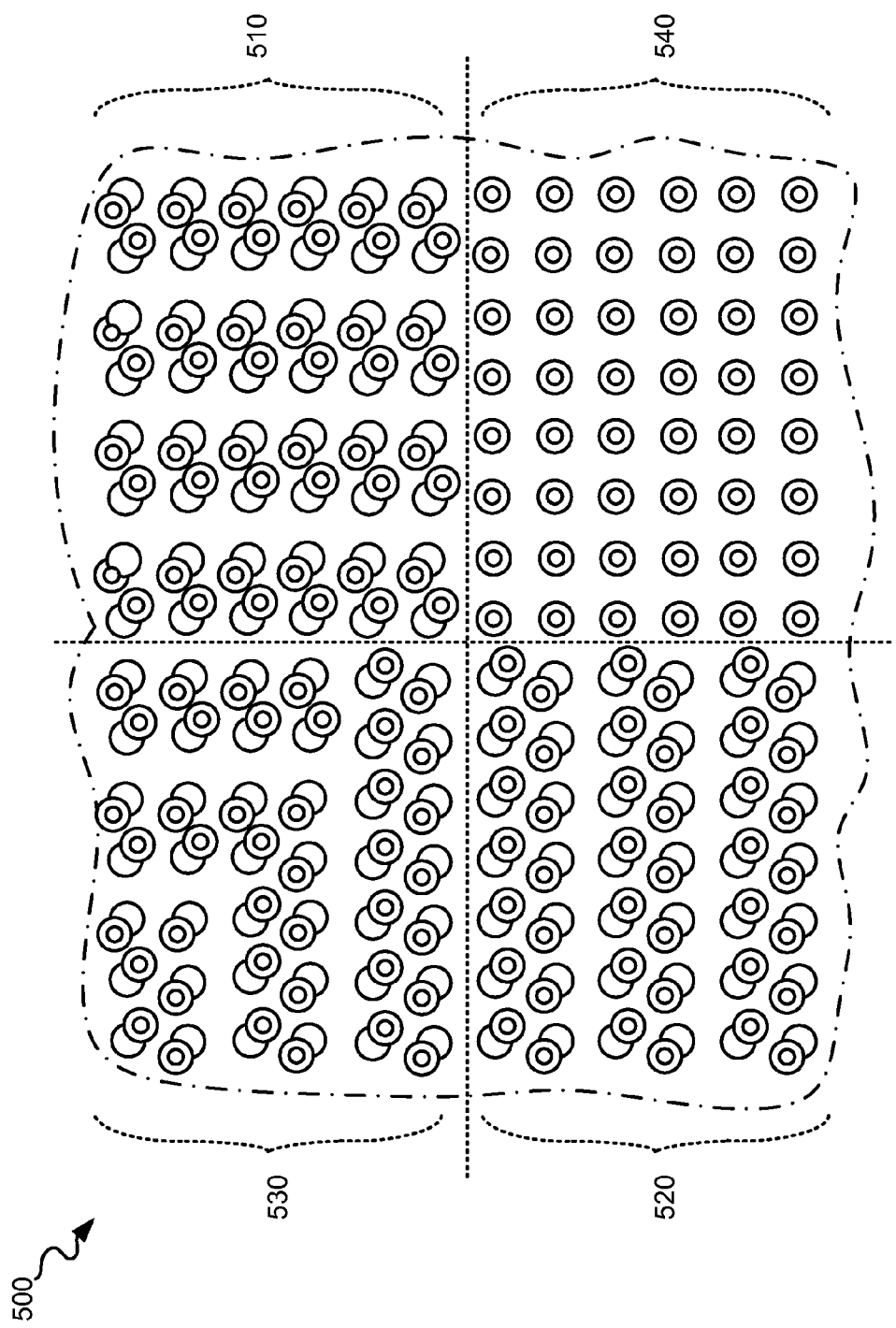
FIG. 5 is a diagram that illustrates an example of a PCB that includes separate quadrants of BGA footprint patterns, including variations of the footprint pattern of FIGS. 2A and 2B.

The BGA footprint pattern described above with respect to FIGS. 2A, 2B, 3A, and 3B may be combined with other BGA footprint patterns, such as shown, for example, on PCB 400 of FIG. 4. As shown in FIG. 4, columns 410 of existing dog-bone footprint elements may be used with columns 225 of BGA footprint elements described herein. Additionally, the orientation and spacing of the BGA footprint elements may be varied in other embodiments. For example, as shown on PCB 500 of FIG. 5, a pattern of BGA footprint elements 510, where the columns are orientated in a vertical direction, may be used with a pattern of BGA footprint elements 520, where the columns are orientated in a horizontal direction. Furthermore, the spacing and orientation of the BGA footprint elements may be varied to create patterns of BGA footprint elements that are similar to the pattern depicted in FIG. 3A but are slightly different. For example, a pattern of BGA footprint elements 530, where the columns may be orientated and spaced to produce concentric patterns of portions of "squares" of BGA footprint elements, may be used. The patterns 510, 520, and 530 of BGA footprint elements may be combined with other types of BGA footprint elements, or other PCB configurations, such as a pattern 540 of vias, as shown in FIG. 5.

CONCLUSION

As described herein, a BGA footprint pattern increases the number of routing channels per PCB layer relative to existing dog-bone BGA footprint patterns. Increasing the number of routing channels per PCB layer enables a reduction in the number of layers in a PCB having a BGA.

The foregoing description of embodiments described herein provides illustration and description, but is not intended to be exhaustive or to limit the embodiments described herein to the precise form disclosed. Modifications and variations are possible in light of the above teachings or may be acquired from practice of the invention.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise. The scope of the invention is defined by the claims and their equivalents.

What is claimed:

1. A printed circuit board (PCB), including a ball grid array (BGA), comprising:
   a first BGA pad having a circular shape;
   a first via having a circular shape,
      the circular shape of the first via overlapping a portion of the circular shape of the first BGA pad and a center of the first via being rotated diagonally relative to a center of the first BGA pad such that the center of the first via relative to the center of the first BGA pad is at a first angle with respect to a first axis that crosses the center of the first via and at a second angle with respect to a second axis that crosses the center of the first via, the first angle and the second angle both being greater than zero degrees and less than ninety degrees;
   a second BGA pad having a circular shape; and
   a second via having a circular shape,
      the circular shape of the second via overlapping a portion of the circular shape of the second BGA pad and a center of the second via being rotated diagonally relative to a center of the second BGA pad such that the center of the second via relative to the center of the second BGA pad is at the first angle with respect to a first axis that crosses the center of the second via and at the second angle with respect to a second axis that crosses the center of the second via, and
      the center of the second via being located at a first distance from the center of the first via and at a third angle relative to the center of the first via.

2. The PCB of claim 1, further comprising:
   a third BGA pad having a circular shape;
   a third via having a circular shape,
      the circular shape of the third via overlapping a portion of the circular shape of the third BGA pad and being rotated diagonally relative to a center of the third BGA pad;
   a fourth BGA pad having a circular shape; and
   a fourth via having a circular shape,
      the circular shape of the fourth via overlapping a portion of the circular shape of the fourth BGA pad and being rotated diagonally relative to a center of the fourth pad, and
      a center of the fourth via being located at the first distance from the center of the third via and at a fourth angle relative to the center of the third via.

3. The PCB of claim 1, where an orientation of the first BGA pad and the first via is reversed by 180 degrees from an orientation of the second BGA pad and the second via.

4. The PCB of claim 1, where the first distance is approximately equal to 36.0 mil.

5. The PCB of claim 1, where the center of the first BGA pad is a second distance from the center of the first via.

6. The PCB of claim 5, where the second distance is approximately equal to 10 mil.

7. The PCB of claim 6, where the center of the second via is the second distance from a center of the second BGA pad.

8. The PCB of claim 1, where the first angle is approximately equal to 27 degrees.

9. The PCB of claim 1, where the third angle is approximately equal to 56 degrees.

10. A printed circuit board (PCB) including multiple layers and a ball grid array (BGA) footprint pattern, the PCB comprising:
    multiple first BGA footprint elements arranged in a first column, each of the first BGA footprint elements comprising a first via and a first BGA pad; and
    multiple second BGA footprint elements arranged in a second column, each of the second BGA footprint elements comprising a second via and a second BGA pad,
    a relative spacing and an orientation between the first BGA footprint elements and the second BGA footprint elements producing three routing channels per layer of the multiple layers of the PCB for the first and second columns,
    a portion of the first via overlapping a portion of the first BGA pad and a center of the first via being rotated diagonally relative to a center of the first BGA pad such that the center of the first via relative to the center of the first BGA pad is at a first angle with respect to a first axis that crosses the center of the first via and at a second angle with respect to a second axis that crosses the center of the first via, the first angle and the second angle both being greater than zero degrees and less than ninety degrees, and
    a portion of the second via overlapping a portion of the second BGA pad and a center of the second via being rotated diagonally relative to a center of the second BGA pad such that the center of the second via relative to the center of the second BGA pad is at the first angle with respect to a first axis that crosses the center of the second via and at the second angle with respect to a second axis that crosses the center of the second via.

11. The PCB of claim 10, where an orientation of each of the second BGA footprint elements is reversed by 180 degrees from an orientation of each of the first BGA footprint elements on the PCB.

12. The PCB of claim 10, further comprising:
multiple third BGA footprint elements arranged in a third column, each of the third BGA footprint elements comprising a third via and a third BGA pad; and
multiple fourth BGA footprint elements arranged in a fourth column, each of the fourth BGA footprint elements comprising a fourth via and a fourth BGA pad,
spacings and orientations of the third BGA footprint elements and the fourth BGA footprint elements enabling three routing channels per layer of the multiple layers of the PCB for the third and fourth columns.

13. The PCB of claim 10, where the first BGA pad and the first via have circular shapes.

14. The PCB of claim 10, where the second BGA pad and the second via have circular shapes.

15. The PCB of claim 12, where the third BGA pad and the third via have circular shapes, and
where the third via overlaps a portion of the third BGA pad and is rotated diagonally relative to a center of the third BGA pad.

16. The PCB of claim 15, where the fourth BGA pad and the fourth via have circular shapes,
where the fourth via overlaps a portion of the fourth BGA pad and is rotated diagonally relative to a center of the fourth pad, and
where a center of the fourth via is located at a third angle relative to the center of the third via.

17. The PCB of claim 10, where
the center of the second via is located at a first distance from the center of the first via,
the center of the first BGA pad is a second distance from the center of the first via,
the center of the second via is the second distance from the center of the second BGA pad, and
the center of the second via is located at a first distance from the center of the first via at a fourth angle relative to the center of the first via.

18. The PCB of claim 17, where
the first distance is approximately equal to 36 mil,
the first angle is approximately equal to 27 degrees,
the second distance is approximately equal to 10 mil, and
the fourth angle is approximately equal to 56 degrees.

19. A printed circuit board (PCB) including multiple layers and a ball grid array (BGA) footprint pattern, the PCB comprising:

multiple first BGA footprint elements arranged in a first column, each of the first BGA footprint elements comprising a first via and a first BGA pad,
the first BGA pad and the first via having circular shapes, and
the first via overlapping a portion of the first BGA pad and a center of the first via being rotated diagonally relative to a center of the first BGA pad such that the center of the first via relative to the center of the first BGA pad is at a first angle with respect to a first axis that crosses the center of the first via and at a second angle with respect to a second axis that crosses the center of the first via, the first angle and the second angle both being greater than zero degrees and less than ninety degrees; and
multiple second BGA footprint elements arranged in a second column, each of the second BGA footprint elements comprising a second via and a second BGA pad,
the second BGA pad and the second via having circular shapes,
the second via overlapping a portion of the second BGA pad and a center of the second via being rotated diagonally relative to a center of the second BGA pad such that the center of the second via relative to the center of the second BGA pad is at the first angle with respect to a first axis that crosses the center of the second via and at the second angle with respect to a second axis that crosses the center of the second via,
the center of the second via being located at a first distance and at a third angle relative to the center of the first via,
relative spacings and orientations between the first BGA footprint elements and the second BGA footprint elements producing three routing channels per layer of the multiple layers of the PCB for the first and second columns, and
an orientation of each of the second BGA footprint elements being reversed by 180 degrees from an orientation of each of the first BGA footprint elements on the PCB.

20. The PCB of claim 19, where
the first distance is approximately equal to 36.0 mil, and
the first angle is approximately equal to 27 degrees.

21. The PCB of claim 19, where
the center of the first BGA pad is a second distance from the center of the first via along the first line through the center of the first via, and
the second distance is approximately equal to 10 mil.

* * * * *